United States Patent
Licata

Patent Number: 5,545,590
Date of Patent: Aug. 13, 1996

[54] CONDUCTIVE RIE-RESISTANT COLLARS FOR STUDS BENEATH RIE-DEFINED WIRES

[75] Inventor: Thomas J. Licata, LaGrangeville, N.Y.

[73] Assignee: International Business Machines Corporation, Armonk, N.Y.

[21] Appl. No.: 298,481

[22] Filed: Aug. 29, 1994

[51] Int. Cl.6 .................................................. H01L 21/44
[52] U.S. Cl. ..................... 437/189; 437/194; 437/198; 437/195
[58] Field of Search .................................. 437/195, 246, 437/200, 197, 198, 194, 189

[56] References Cited

U.S. PATENT DOCUMENTS 4,589,196  5/1986  Anderson.
4,666,737  5/1987  Gimpelson et al..
5,270,254  12/1993  Chen et al. ............................ 437/190
5,356,833  11/1994  Maniar et al..

FOREIGN PATENT DOCUMENTS 5166750  7/1993  Japan.
0621218  1/1994  Japan.

Primary Examiner—George Fourson
Assistant Examiner—C. Everhart

[57] ABSTRACT

An improved method of forming interlayer interconnections employs the same material (or materials that are etched similarly) for both the stud and the upper interconnect in which the stud is surrounded by a collar of conductive material that is also resistant to the etching process used to define the upper wire interconnect.

8 Claims, 2 Drawing Sheets

5,545,590

CONDUCTIVE RIE-RESISTANT COLLARS FOR STUDS BENEATH RIE-DEFINED WIRES

TECHNICAL FIELD

The field of the invention is that of integrated circuit processing for large scale integrated circuits having conductive vertical studs between interconnection levels.

BACKGROUND OF THE INVENTION

In multi-level metal interconnection layers, it is required for adequate planarity and yield that there be vertical conductive members, referred to as studs, connecting one level of interconnection with another. This requirement results from the fact that thin metal going over corners or into an aperture between layers tends to cover poorly and thus to detract from adequate yield. Further, tapered vias use more area than vertical vias, thereby reducing usable device density.

When an upper metal layer (e.g. Al) over a preexisting stud is patterned in a reactive ion etch (RIE) process and the wire is borderless to the stud and made of the same material or a material etched by the same gases, the inevitable misalignment exposes part of the stud to the etching gases, so that a portion of the stud is removed, as shown in FIG. 2. If tungsten (W) is used as a stud material below Al, little stud material is removed, but the finished structure contains a W-Al interface that degrades electromigration resistance through flux divergence and blockage of the transport of Cu alloying atoms. In addition, W has low conductivity. If an Al stud is used instead of W, conductivity and reliability are improved, but damage to the stud by wire RIE is increased, reducing yield and reliability.

In a less conventional method, monolithic stud/wires can be constructed by filling a via hole with metal in such a manner as to leave a largely planar overburden. Wires are then formed by patterning the overburden. This process has lower cost and enhanced intrinsic material reliability compared to the discrete stud/wire approach, but suffers from the same problem of stud damage during wire level RIE. In high density layouts, where the tolerances are reduced to the extent that a wire over the stud has the same dimension as the stud, so that there is only partial overlap of the wire, inevitable misalignment will also expose the stud to the etching gases.

SUMMARY OF THE INVENTION

The invention relates to an improved method of forming interlayer interconnections in which the same material (or materials that are etched similarly) is used for both the stud and the upper interconnect and in which the stud is surrounded by a sidewall of conductive material that is also resistant to the etching process used to define the wire interconnect. In the particular case of Al interconnections, the stud sidewall exhibits a greater resistance to the etching process than the Al does.

BEST MODE OF CARRYING OUT THE INVENTION

Figure 1:
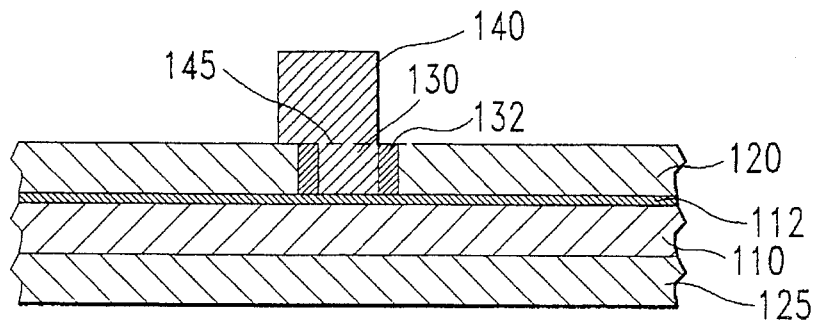
FIG. 1 illustrates in cross-section a combined upper interconnect and stud according to the invention.
Figure 2:
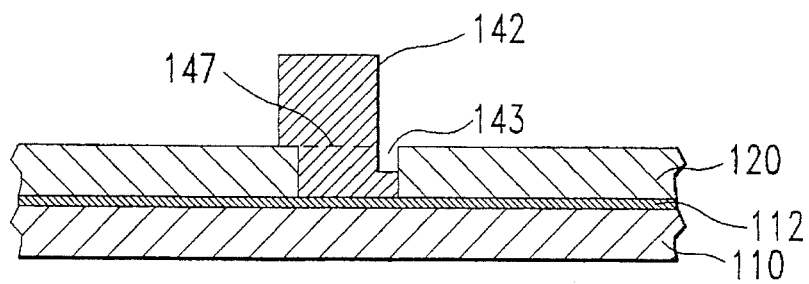
FIG. 2 illustrates in cross-section a stud according to the prior art.

Referring now to FIG. 1, there is shown a cross-section of an area of interconnections showing a dielectric 125 at the bottom of the figure above which a horizontal layer 110 of conductive interconnection, such as Al, polycrystalline silicon (poly), or any other convenient material extends sideways in the drawing. Such a layer may be referred to as a conductive member, which may be a wire, a stud extending to a lower layer, or a contact on a device, such as a transistor or resistor. This lower layer 110 (when Al is used) is conventionally capped by a thin layer 112 of a TiN (Titanium Nitride) layer used as an antireflective layer to facilitate lithographic alignment. Above Al layer 110, there is a dielectric layer 120, illustratively $SiO_2$. In $SiO_2$ layer 120, there is a stud 130 formed which connects layer 110 to an upper layer 140 shown as a wire member extending perpendicular to the plane of the paper. The stud may be formed in a separate operation in which a stud filler material (with appropriate RIE-resistant collar) is deposited and planarized such as by chemical-mechanical polishing (CMP) to be level with the top of dielectric 120. The dotted line labelled with the numeral 145 in FIG. 1 and with the numeral 147 in FIG. 2 illustrates the interface between the stud material and the upper interconnect material when this option is used.

On the edges of an aperture through oxide layer 120, there is a collar 132 formed from conductive material that is resistant to the RIE process used to pattern layer 140. For purposes of this invention, the term "resistant" and "having etch resistance" as applied to RIE will be taken to mean that the etch rate of the RIE-resistant collar is less than 75% of the etch rate of the upper interconnect material. Illustratively, the standard chemistry of Cl-based Al RIE processes ($BCl_3$-Cl) is used. Co and $CoSi_2$ have been shown to be effective as etch stops having a substantial resistance to these standard Cl-based Al etching gases. These materials are also fairly conductive, (approximately 10 and 17 $\mu\Omega$-cm for Co and $CoSi_2$, respectively). The conductivity of the collar material is not critical and will depend on the usual engineering tradeoffs, such as the amount of space available and the tolerable total resistance. Typically, a conductivity threshold of 75 $\mu\Omega$-cm should be adequate for most applications. Alternatively, an Al alloy collar such as Al 4% Cu or an intermetallic compound such as $Al_2Cu$ may be used.

An attractive collar material for Al interconnects is Cu. In that case, a RIE process adding $Cl_2$ and $NH_3$ to the conventional $SiCl_4$ and $N_2$ gases, as shown in Ohno, et al in "High Rate Reactive Etching of Copper Films in $SiCl_4$" 22nd International Conference on Solid State Devices and Materials, Business Center for Acad. Soc., Tokyo, 1990 pp. 215–218 is used to define a Cu collar and a conventional RIE for Al etches the Al but not the Cu. An anneal may be used to dissolve the Cu into the Al stud after the upper interconnect has been patterned.

Moreover, the presence of a redundant conductor in the stud improves stud reliability against open circuit failures since intermetallic or refractory collar materials resist electromigration more than does Al. Silicides, some aluminides, nitrides and heavy, sputter etch resistant materials like W, Ta, Mo and silicides and nitrides of these materials have high melting points. Thus, unlike Al, their atomic mobility is low at conventional temperatures and they resist electromigration.

The studs according to the invention may be formed by a number of processes. In all cases, the final collar thickness will be set to allow for expected misalignment. In the first case, the collar is formed from a conformal layer of either sputtered or CVD Ti, followed by a layer of CVD W or $WSi_2$. A collar is formed using an appropriate directional etch. Note that RIE lag or recessing of the underlying wire (W or other material) by the collar etch is not a concern in this case since the primary objective is to remove the film from the upper oxide surface and etch rates are lower in recessed holes. An alternative is the removal of the collar material from the top of the dielectric after the metal RIE, though this will remove some of the metal collar from the stud.

Ti, W, $Wsi_2$ and Cu display etch selectivities against Al etching of about 1:3, 1:7, 1:2, and 1:10 respectively for Cl based chemistry, thus giving adequate protection against overetching. This and other figures for etch selectivity are for Cl-based chemistry. The selectivity can be increased by a factor of about 10× by the use of HI-based etch chemistry. The conformal coverage afforded by conventional CVD deposition processes yields a straight sidewall in the oxide aperture conducive to subsequent PVD plasma deposition Al fill or CVD fill. The tapered collar tip also helps subsequent PVD based fill.

In a second method, a conformal layer of Co (1:10 selectivity) can be formed by depositing PVD Co, filling the holes with photoresist, then planarizing by Chemical Mechanical Polishing. This method is also applicable to other PVD and CVD layers such as Ti, W, $Wsi_2$. Note that the use of a PVD metal film may result in slightly recursive sidewalls that may make subsequent Al fill more difficult by inducing a negative taper in the aperture sidewalls.

In a third method, a layer of Si is put down producing a Si collar on the sidewalls of the oxide aperture. Then a layer of refractory metal such as Co or W can be deposited by PVD or CVD such that enough metal exists at the thinnest point to consume all of the sidewall silicon in a subsequent silicidation reaction. The films are then heated to cause the two materials to react to form a metal mono-silicide (30 s at 425° C.), and a wet etch is applied to remove the unreacted metal. A second thermal treatment of 30 s at 700° C. may be used to convert the mono-silicide to di-silicide if desired. $CoSi_2$ and $Wsi_2$ yield selectivities of 1:10 and 1:2 against Al etch, respectively. Preferably, the CVD Si spacer is formed at a deposition temperature of <500° C. to limit the reaction of silicon with an underlying W wire if that is used.

In yet another method, a spacer comprising an intermetallic compound is formed on the sidewall. For example, $Al_2Cu$ precipitates are extremely resistant to etching using standard Cl-based chemistry. The spacer can be formed by PVD or CVD of the Al-Cu compound, followed by either directional dry etch using tailored chemistry having a high sputter component, such as described in the Ohno reference, or by a photoresist-capped or analogous CMP process. A conventional anneal may be necessary in order to form the intermetallic compound. Alternatively, this can be done in a self-aligned manner by forming a sidewall of the first metal, depositing the second metal then reacting and removing the unreacted surface metal.

In all of the preceding cases, the film thicknesses are chosen to yield a final spacer thickness matching the expected nominal wire stud misalignment. In a particular example, for a nominal 0.25 μm groundrule, tolerances are combined to give an effective misalignment of 0.08 μm. Those skilled in the art will readily appreciate that the dimensions chosen are part of the yield calculation and some designers will prefer to use a smaller sidewall and accept some stud exposure, while some would prefer to use a greater margin. The particular value chosen will depend on the usual engineering tradeoffs of the process in question.

Figure 3:
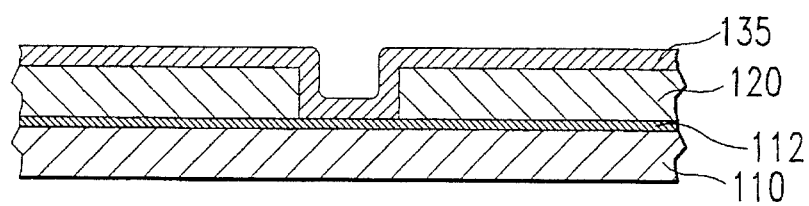
FIGS. 3–7 illustrate intermediate steps in the formation of the embodiment of FIG. 1.
Figure 4:
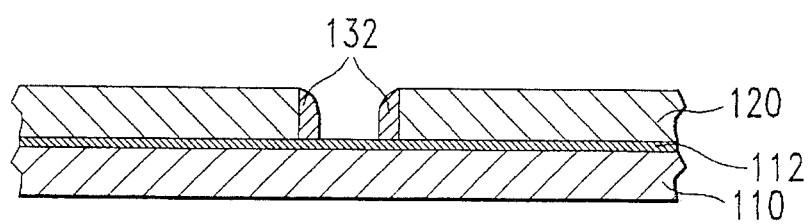
Figure 5:
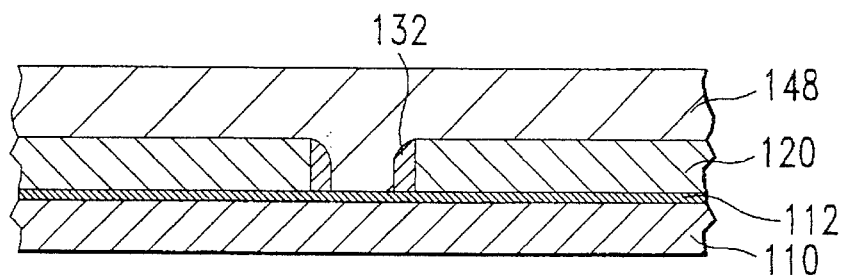

Referring now to FIGS. 3–7, there are shown selected intermediate steps in the process in FIG. 3, the aperture has been formed in layer 120 by any convenient method, such as RIE, and a conformal layer 135 of the collar material has been formed by any of the methods described above. Next, in FIG. 4, an optional step has been performed, in which the portion of layer 135 on top of layer 120 has been stripped by an appropriate conventional step, well known to those skilled in the art, such as fluorine-based RIE for W, as described in Tungsten and Tungsten Silicide Etching in Halogenated Plasmas" by D. W. Hess, Solid State Technology, April 1988, p. 97, or sputter etching for Co. Note that it is an advantageous feature of the invention that it does not matter if some of material 135 is left on the bottom of the aperture, forming a liner instead of a collar having an open bottom, since the material is conductive, so that for the purpose of the claims, the word "collar" will be taken to mean both the case where there is no etch-resistant material remaining on the bottom of the aperture (i.e. where the lower conductive material is exposed) and the case where there is some of the etch-resistant material remaining on the bottom of the aperture.

Figure 6:
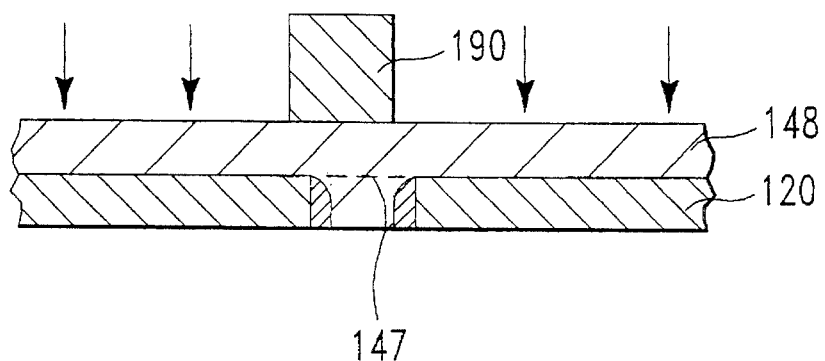
Figure 7:
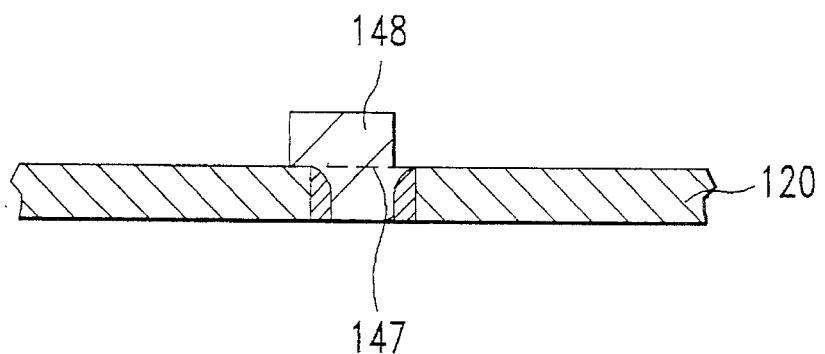

After these steps, layer 148 of upper interconnect (illustratively aluminum) has been deposited, filling the aperture and extending over layer 120. Optionally, layer 148 may be planarized by any conventional step such as etchback, CMP, or reflow to reduce the depression shown above the aperture. Following this step, layer 148 is patterned to produce the result shown in FIG. 1. FIG. 6 illustrates a patterning operation in which the remaining interconnect 148 is defined using a photoresist mask 190 that is misaligned and FIG. 7 illustrates the results of the patterning operation. In both figures, a dotted line illustrates an optional interface between a separate stud layer and the upper interconnect.

Those skilled in the art will appreciate that the inventive method may be carried out in alternative versions, such as filling a via with a composite stud having a RIE resistant collar and polishing the stud coplanar with the dielectric, after which the upper layer of interconnect material may be deposited and patterned. Many combinations of material may used, including Al, Cu, W polysilicon and combinations of different stud and upper interconnect materials. The term "including a refractory metal as a constituent" as applied to a collar will be used to indicate that the collar can be a refractory metal (e. g. W) itself or a silicide containing the refractory metal (e.g. $Wsi_2$) or a nitride containing a refractory metal (e. g. TiN or TaSiN).

Those skilled in the art will readily appreciate that different embodiments of the invention may be made in view of the enclosed teaching and the following claims are not meant to be limited to the embodiments disclosed.

I claim:

1. A method of forming an interconnection member in an integrated circuit containing at least one lower conductive member covered by a first interlayer dielectric having a dielectric top surface, comprising the steps of:

forming an aperture having aperture sidewalls in said first interlayer dielectric;

forming an interlayer aperture collar of Cu on said aperture sidewalls, said interlayer collar having a collar thickness greater than or equal to a nominal wire stud misalignment, being substantially constant vertically through said aperture, having a conductivity greater than about 75 μΩ-cm and having etch resistance to an upper etching process;

forming a first layer of an upper conductive material on said dielectric top surface and extending in said aperture in contact with said interlayer collar; and patterning said upper conductive material with said upper etching process, whereby exposed portions of said interlayer collar resist etching during said patterning.

2. A method according to claim 1, in which said first layer of an upper conductive material formed on said dielectric top surface and extending in said aperture in contact with said interlayer collar is a stud material and said layer of stud material is planarized coplanar with said dielectric top surface, after which a second layer of upper conductive material is formed on said dielectric top surface and in contact with said stud material and said interlayer collar.

3. A method according to claim 2, in which said stud material and said second upper conductive material are the same material.

4. A method according to claim 2, in which said stud material and said second upper conductive material are different materials.

5. A method of forming an interconnection member in an integrated circuit containing at least one lower conductive member covered by a first interlayer dielectric having a dielectric top surface, comprising the steps of:

forming an aperture having aperture sidewalls in said first interlayer dielectric;

forming an interlayer aperture collar of $Al_2Cu$ on said aperture sidewalls, said interlayer collar having a collar thickness greater than or equal to a nominal wire stud misalignment, being substantially constant vertically through said aperture, having a conductivity greater than about 75 $\mu\Omega$-cm and having etch resistance to an upper etching process;

forming a first layer of an upper conductive material on said dielectric top surface and extending in said aperture in contact with said interlayer collar; and patterning said upper conductive material with said upper etching process, whereby exposed portions of said interlayer collar resist etching during said patterning.

6. A method according to claim 5, in which said first layer of an upper conductive material formed on said dielectric top surface and extending in said aperture in contact with said interlayer collar is a stud material and said layer of stud material is planarized coplanar with said dielectric top surface, after which a second layer of upper conductive material is formed on said dielectric top surface and in contact with said stud material and said interlayer collar.

7. A method according to claim 6, in which said collar of $Al_2Cu$ is deposited in a single step.

8. A method according to claim 6, in which said collar of $Al_2Cu$ is formed by the steps of depositing a first layer of one of Al and Cu, depositing a second layer of the other of Al and Cu, and reacting said first and second layers to form $Al_2Cu$.

* * * * *